United States Patent
Kraft et al.

(10) Patent No.: US 8,134,179 B2
(45) Date of Patent: Mar. 13, 2012

(54) PHOTODIODE WITH A REDUCED DARK CURRENT AND METHOD FOR THE PRODUCTION THEREOF

(75) Inventors: Jochen Kraft, Oberaich (AT); Bernhard Löffler, Gleisdorf (AT); Gerald Meinhardt, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 201 days.

(21) Appl. No.: 11/922,255

(22) PCT Filed: Apr. 28, 2006

(86) PCT No.: PCT/EP2006/004027
§ 371 (c)(1),
(2), (4) Date: Oct. 28, 2009

(87) PCT Pub. No.: WO2006/133765
PCT Pub. Date: Dec. 21, 2006

(65) Prior Publication Data
US 2010/0038678 A1    Feb. 18, 2010

(30) Foreign Application Priority Data
Jun. 14, 2005   (DE) .................. 10 2005 027 456

(51) Int. Cl.
*H01L 31/036*    (2006.01)

(52) U.S. Cl. ............ 257/184; 257/19; 257/21; 257/188; 257/201; 257/441; 257/461; 257/E31.023; 257/E31.044

(58) Field of Classification Search .................... 257/12, 257/19, 21, 184, 188, 201, 441, 461, E31.023, 257/E31.024, E31.044
See application file for complete search history.

(56) References Cited

U.S. PATENT DOCUMENTS

| 3,745,424 | A | | 7/1973 | Ohuchi et al. |
| 5,552,616 | A | * | 9/1996 | Kobayashi .................... 257/184 |
| 5,821,149 | A | * | 10/1998 | Schuppen et al. ............ 438/312 |
| 6,534,335 | B1 | | 3/2003 | Rhodes et al. |
| 6,586,818 | B1 | * | 7/2003 | Voldman ....................... 257/587 |
| 7,091,099 | B2 | * | 8/2006 | Ohnishi et al. ............... 438/320 |
| 7,459,367 | B2 | * | 12/2008 | Voegeli et al. ............... 438/309 |
| 2002/0158311 | A1 | * | 10/2002 | Ohnishi et al. ............... 257/591 |
| 2002/0185588 | A1 | | 12/2002 | Wagner et al. |
| 2004/0016941 | A1 | | 1/2004 | Yanagisawa et al. |
| 2005/0001277 | A1 | | 1/2005 | Rhodes et al. |
| 2005/0090074 | A1 | | 4/2005 | Mouli et al. |

FOREIGN PATENT DOCUMENTS

| EP | 0 727 824 A2 | 8/1996 |
| JP | 57093584 A | 6/1982 |
| JP | 61095580 A | 5/1986 |
| JP | 2003282927 A | 10/2003 |
| WO | WO 2005/036646 A1 | 4/2005 |

* cited by examiner

*Primary Examiner* — Jerome Jackson, Jr.
*Assistant Examiner* — Yu Chen
(74) *Attorney, Agent, or Firm* — Cozen O'Connor

(57) ABSTRACT

A photodiode in which a pn junction is formed between the doped region (DG) formed in the surface of a crystalline semiconductor substrate and a semiconductor layer (HS) deposited above said doped region. An additional doping (GD) is provided in the edge region of the doped zone, by means of which additional doping the pn junction is shifted deeper into the substrate (SU). With the greater distance of the pn junction from defects at phase boundaries that is achieved in this way, the dark current within the photodiode is reduced.

9 Claims, 3 Drawing Sheets

PHOTODIODE WITH A REDUCED DARK CURRENT AND METHOD FOR THE PRODUCTION THEREOF

RELATED APPLICATIONS

This is a U.S. national stage of application No. PCT/EP2006/004027, filed on 28 Apr. 2006.

This patent application claims priority of German patent application No. 10 2005027456.0 filed 14 Jun. 2005, the disclosure content of which is hereby incorporated by reference.

FIELD OF THE INVENTION

The present invention is related to a photodiode with a reduced dark current, and to a production method for fabricating such a photodiode.

BACKGROUND OF THE INVENTION

Semiconductor components, for example photodiodes or phototransistors, can be used for detecting light. What is common to said components is that they have a pn junction around which a space charge zone forms, which zone can be enlarged by means of a correspondingly applied external voltage. Light absorbed by the semiconductor body generates charge carrier pairs which can be separated in the intrinsic or external electric field and be conducted to corresponding external contacts. The electric current thus accumulated at the external contacts represents a measure of the incident light.

WO 2005/036646 A1 discloses e.g. a semiconductor circuit comprising a photodiode having two horizontally running semiconductor junctions.

In particular forward-balanced diodes and transistors exhibit diode leakage currents which are present when voltage is applied and also when light is turned off. Said leakage currents limit the sensitivity of the photodiodes and represent a noise source which cannot be exactly separated from the actual photocurrent.

Dark currents are generated by defects in the semiconductor material of the diode. Defects have energetic states positioned between the valence band and the conduction band. Charge carriers can therefore pass into the conduction band much more easily from such defects at a given temperature. If the defect is situated within the field present or within the space charge zone, the charge carriers or charge carrier pairs thus generated are also fed to the corresponding contacts and produce the abovementioned dark current.

Defects occur in particular at phase boundaries or else at surfaces. Defects can also be produced within the semiconductor body by high-energy implantations.

A high-quality photodiode or phototransistor is permitted to have only a minimal dark current. Therefore, endeavors are made to reduce the number of defects. For this purpose, it has already been proposed to produce the semiconductor junction in the diode by means of an epitaxial method by growing a crystalline layer doped oppositely to the semiconductor body. This makes it possible to reduce the crystal defects at the diode boundary layer.

A further possibility for reducing the dark current consists in using a semiconductor having a larger band gap, in which it is more difficult for charge carriers to cross over to the conduction band even in the dark.

The dark current generated by diffusion can also be reduced by a higher doping of the more lightly doped diode layer since the saturation current $J_s$ is proportional to $e^{-EG/nT}$ and inversely proportional to N, where EG is the electronic band gap and N is the dopant concentration.

However, surface and interface defects cannot be improved by means of this measure. These are in particular additional defects at interfaces between silicon and silicon oxide, the latter usually being used for defining the active diode zone and for insulating the latter. Furthermore, defects and impurities can arise during the trench etching, during the etching of nitride or during the production of field oxide.

SUMMARY OF THE INVENTION

It is an object of the present invention, therefore, to specify a diode with reduced dark current and a production method.

This and other objects are attained in accordance with one aspect of the present invention directed to a diode comprising a crystalline substrate composed of a semiconductor material; a doped region of a first conductivity type formed at the surface of a substrate; a semiconductor layer, which is applied on the surface of the substrate above the doped region and which has a doping of a second conductivity type; a pn junction at the boundary between the doped region and the semiconductor layer; wherein, in lateral areas of the doped region, the pn junction is arranged in the substrate at a distance from the boundary between the surface of the substrate and the semiconductor layer.

A diode is proposed whose semiconductor junction is formed between a doping zone of the first conductivity type, which is arranged in the surface of a crystalline substrate, and a first semiconductor layer applied thereto and having a doping of the second conductivity type. In this case, the pn junction is arranged in lateral areas of the doped region to be at a distance from the boundary between substrate and first semiconductor layer and therefore deeper in the substrate. This has the effect that defects at the surface of the substrate or at the edge of the doped region lie within a region doped with dopant of the second conductivity type and hence outside the space charge zone. This prevents the situation where charge carriers arising in said defects are transported toward the contacts of the diode within the intrinsic or extrinsic field of the space charge zone and contribute to the dark current there.

The crystalline substrate of the diode comprises any desired semiconductor material at least at the surface. The substrate can be a homogeneous wafer, but can also have one or a plurality of semiconductor layers that are applied on a basic wafer subsequently by means of epitaxy, for example, and differ with regard to composition or doping. The first semiconductor layer is applied on the substrate for example likewise by means of epitaxial deposition in a CVD method. The first semiconductor layer is preferably very thin. For building up the field it therefore requires a very highly doped region, below which, however, an intrinsic layer region can additionally be situated. The pi junction is therefore sharp and the depletion zone extends over the phase boundary both into the first semiconductor layer and into the first doped region.

Preferably, the first semiconductor layer is made sufficiently thin and has for example a thickness of at most 100 nm. This guarantees that a large part of the space charge zone is formed within the semiconductor substrate, that exclusively the first semiconductor layer is highly doped and the substrate therefore has only a low dopant concentration in the region of the space charge zone, which is advantageous for the use of the diode as a photodiode. A low dopant concentration reduces the number of potential recombination centers in the substrate which can contribute to a reduction of the photocurrent.

The doping zone is advantageously enclosed by an insulation zone. Said insulation zone reaches into the substrate and is formed for example as field oxide or as a trench etched into the substrate and filled with insulation material, in particular as so-called STI isolation (shallow trench isolation). The insulation zone can be formed around the doping zone of the first conductivity type. However, it is also possible to form the first doping zone in a region closed by the insulation zone.

An additional doping of the second conductivity type can be provided at the lateral edge of the doping zone, in particular near the boundary with the insulation zone, with the aid of which additional doping the pn junction is shifted deeper into the substrate in this region. Thus, the interface with the insulation zone, said interface being greatly beset by defects and defects, is remote from the pn junction and thus also from the space charge zone, thereby precluding a principal source for the production of dark current. The doping of the second conductivity type is extended into the substrate in this way.

The diode can also be part of a transistor. For this purpose, arranged above the first semiconductor layer are at least area portions of a second semiconductor layer having a doping of the first conductivity type, which represents the emitter for the diode formed from substrate (collector) and first semiconductor layer (base). For the use as a phototransistor, the second semiconductor layer is minimized with regard to its basic area and arranged for example only at the edge of the active diode area (transistor area) or only centrally. This avoids an excessively large shading of the active component area in the event of light incidence.

The substrate can comprise monocrystalline silicon. The first semiconductor layer is advantageously a silicon-germanium layer. A germanium concentration profile with the highest germanium concentration at the phase boundary toward the substrate can be arranged within said layer. It is thus possible to generate an additional field which accelerates the charge carriers.

The first semiconductor layer is preferably formed in large-area fashion and extends not only over the active diode zone, but also beyond the insulation zone. It is thereby possible to use this portion reaching beyond the active diode zone for the electrical connection of said layer. For this purpose, this connection region can be provided with a higher conductivity, for example by a higher doping of the second conductivity type. The overlap zone between first semiconductor layer and first doped region can be defined by the delimiting insulation zone. However, it is also possible to provide between the two layers an insulation layer, and in particular an oxide layer, in which an opening was produced above the doped region, which opening can define the direct phase boundary and thus the active diode zone or the area of the pn junction. The window within said insulation layer can therefore be smaller but also larger than the region surrounded by the insulation zone.

Another aspect of the invention is directed to a method for producing a diode with reduced dark current that comprises the steps of:

a) producing a doped region of the first conductivity type in the surface of a substrate composed of a semiconductor material, b) defining an active zone in the surface of the substrate by forming an insulation zone enclosing the doped region in ring-shaped fashion, c) applying a doped semiconductor layer of the second conductivity type, d) introducing an additional doping of the second conductivity type into the substrate in the region of the phase boundary between active zone and insulation zone.

Various methods are appropriate for introducing the additional doping at the edge of the active zone.

It is possible to perform the additional doping by masked implantation after the semiconductor layer has been applied. In this case, that part of the first semiconductor layer which is intended to form the lead can be doped more highly outside the active region in a targeted manner by means of an implantation and the mask required for this purpose can be established such that, during the implantation, the abovementioned additional doping is concomitantly produced at the edge of the active zone within the substrate.

It is also possible to produce a sufficiently high doping in the first semiconductor layer outside the active zone and to cause it to indiffuse into the substrate into the edge region of the active zone by means of a heat treatment step, the additional doping arising there. This can be supported by implanting a dopant with a higher penetration depth, with a greater diffusion capability or with a higher implantation energy.

Moreover, it is possible to perform the implantation of the first semiconductor layer outside the active region with a mask that shades the active region, but to conduct the implantation at an oblique angle relative to the surface of the substrate, such that part of the dopant can pass under the mask and into the edge region of the doped region in the substrate, where the additional doping can lead to a counterdoping. Advantageous oblique implantation angles lie between 80° and 45°, where 90° represents a vertical implantation relative to the surface of the substrate.

During the oblique implantation or between two steps of the oblique implantation it is possible to rotate the substrate, such that dopant of the second conductivity type can penetrate uniformly under the mask into the substrate from all spatial directions. The oblique implantation is preferably carried out in four steps between which the substrate is rotated in each case by 90°.

In a further embodiment, the diode can be extended to form a transistor. For this purpose, an insulation layer is produced above the first semiconductor layer, an emitter window being opened in said insulation layer and the first semiconductor layer being uncovered there. Afterward, an emitter layer is deposited above the insulation layer and patterned with the aid of a mask in an etching step. For this purpose, a resist mask can be used, which can remain on the substrate and serve as an implantation mask during the subsequent implantation of dopant for more highly doping the connection line within the first semiconductor layer.

A further possibility for producing an additional doping utilizes a further process step known from CMOS technology, which process step can improve the electrical insulation of a plurality of semiconductor components arranged alongside one another on a wafer. This step, also known as field oxide implant or anti-punch-through implant, comprises a high-energy implantation of dopant of the second conductivity type into the region below the insulation zone, that is to say usually below the field oxide insulation that encloses the active diode region, consequently the doping zone. An FOX implant mask is used as implantation mask and is formed here for producing the desired additional doping in such a way that the dopant also reaches the edge of the active zone during the implantation and produces an additional doping or a counterdoping there.

It is possible to produce the additional doping using boron ions. The latter have a high mobility and a high penetration depth during the implantation.

The invention is explained in more detail below on the basis of exemplary embodiments and the associated figures. These serve solely for illustrating the invention and have therefore been drawn up only schematically and not true to scale. Moreover, the invention is not restricted either to the figures or to the exemplary embodiments. Identical or identically acting parts are designated by identical reference symbols.

DETAILED DESCRIPTION OF THE DRAWINGS

Figure 1:
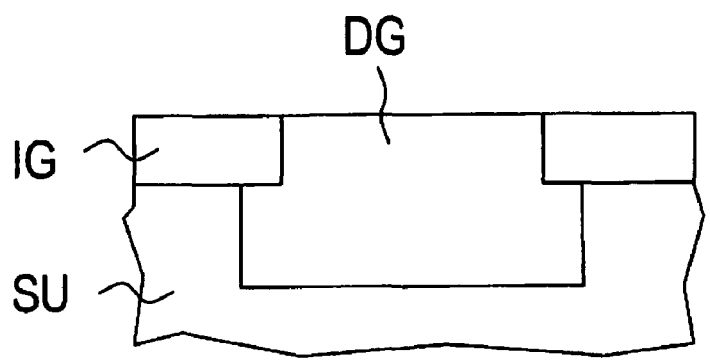
FIGS. 1 to 4 show different method stages during the production of a diode according to the invention on the basis of schematic cross sections.

FIG. 1 shows in schematic cross section a crystalline semiconductor substrate SU, in which a doped semiconductor region DG of the first conductivity type is arranged. Said doped region can extend over the entire surface of the substrate or, as illustrated in the figure, form only a narrowly delimited region at the surface of the substrate. The doped region DG is enclosed in ring-shaped fashion by an insulation zone IG formed for example from field oxide by oxidation of the substrate surface. The doped region can be produced before or after the production of the insulated zones. The figure does not illustrate means for making contact with the doped region or for producing a connection. The latter can be effected for example by means of a buried layer arranged below the doped region. The connection to the surface of the substrate or to the surface of the finished component can then be effected by means of a doped connection zone reaching as far as the surface (likewise not illustrated in the figure).

Figure 2:
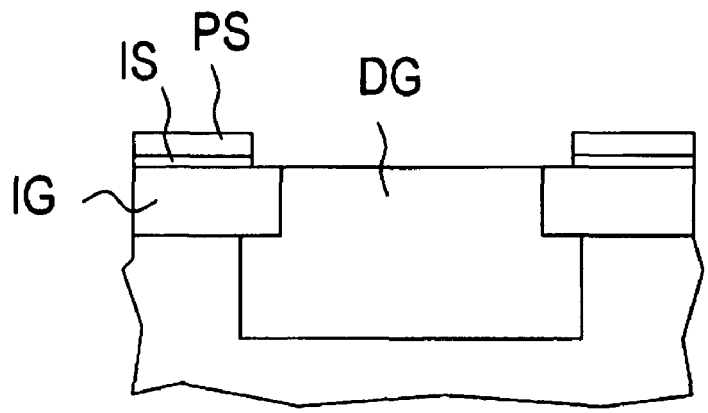

In the next step, a thin insulation layer IS is deposited onto the substrate over the whole area, and a polysilicon layer PS is deposited above said insulation layer. With the aid of a photomask, a window is subsequently etched into the two layers and underneath the surface of the doped region DG is uncovered. The window is dimensioned such that part of the insulation zone IG is also concomitantly uncovered. FIG. 2 shows the arrangement at this method stage.

Figure 3:
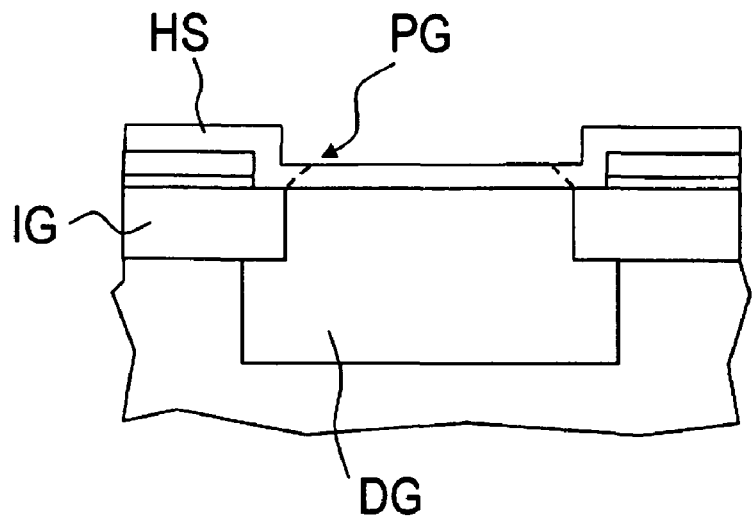

In the next step, a semiconductor layer HS is applied over the whole area. For this purpose, a silicon-germanium layer is grown under epitaxial conditions for example by means of a CVD method. Said layer forms in monocrystalline fashion in contact with the substrate surface, but in contrast in polycrystalline fashion above the insulated zones or the amorphous polysilicon layer PS. The phase boundary of the monocrystalline region above the doped region DG is indicated by the dashed line PG in FIG. 3.

The polysilicon layer PS serves, during the epitaxial deposition, for reducing the surface reflectivity in order to enable a homogeneous heating of the surface by means of radiation heating. It also becomes clear from FIG. 3 that the window etched in polysilicon layer PS and insulation layer IS is larger in area than the doped region DG uncovered at the surface of the substrate. It is only in this way that it is possible to position the substrate step outside this active diode area defined by the uncovered surface of the doped region, since an additional substrate step at the boundary of a field oxide insulation zone would result in an excessively steep or high topological step above which the homogeneous deposition of further layers with sufficient layer thickness would be possible only with difficulty.

Figure 4:
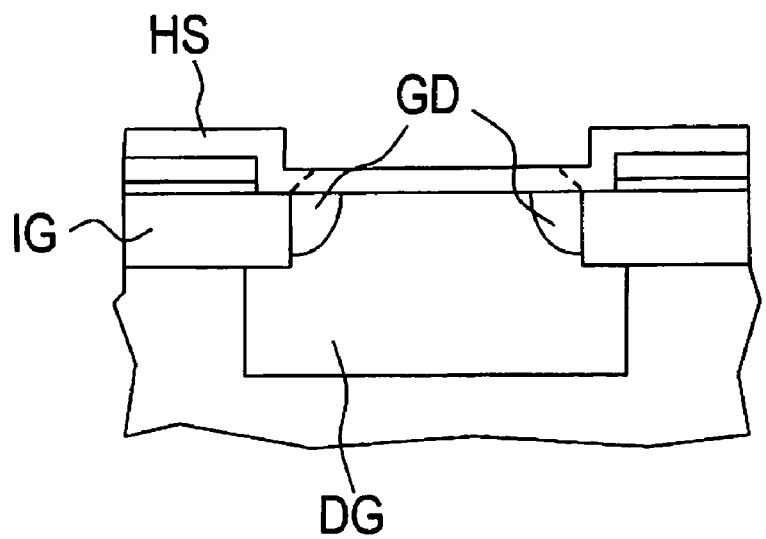

FIG. 4 shows the component with additional doping GD already produced in the edge region of the doped region DG or at the interface between the doped region and the surrounding insulation zone IG. In one exemplary embodiment, the doping of the first conductivity type in the doped region DG corresponds to an n-type doping, such that both semiconductor layer HS and additional doping GD have a p-type doping. It becomes clear from FIG. 4 that the pn junction is formed in the center of the active zone between semiconductor layer HS and surface of the substrate in the doped region DG, but at the edge region it is formed at the interface between doped region DG and additional doping GD. The pn junction is thus remote from the defect-rich interface between substrate and insulation zone IG and from the phase transition between monocrystalline and polycrystalline semiconductor layer HS. Charge carriers arising at said defects therefore pass with reduced probability into the region of the field of the space charge zone and thus do not contribute to the dark current.

The precise shaping of the additional doping is only indicated schematically in FIG. 4 and can also be formed such that it reaches deeper, is shallower or else narrower, depending on the production method used.

Figure 5A:
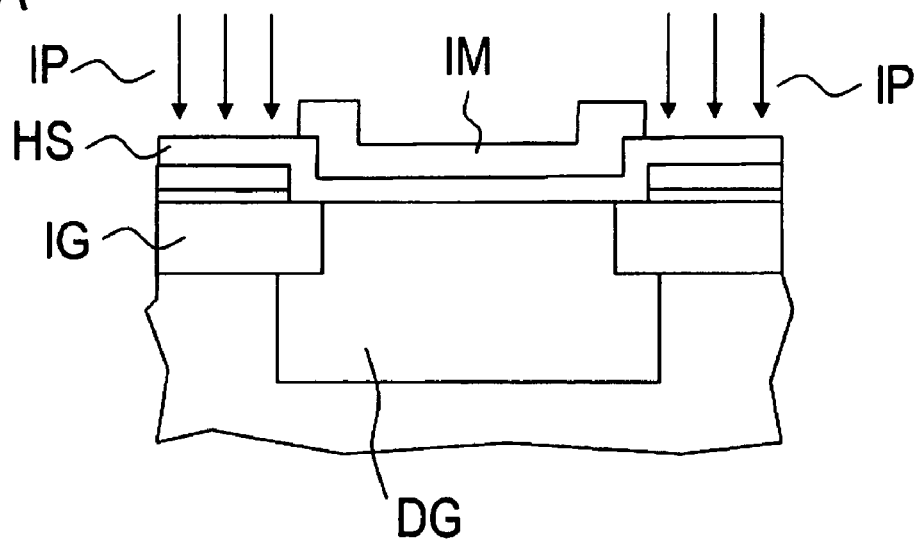
FIG. 5 shows the implantation of the connection line.

FIG. 5A shows a simple possibility of producing the additional doping GD together with doping the semiconductor layer HS more highly in order to produce a low-impedance connection to the semiconductor layer outside the active region. For this purpose, an implantation mask IM, for example a photoresist mask, is produced above the active region. In order to increase the conductivity of the semiconductor layer HS in the region not covered by the implantation mask IM, an implantation IP with a dopant of the second conductivity type is then carried out. In this case, there is the possibility of choosing the dopant dose to be high enough such that, in a subsequent heat treatment step, the dopant diffuses right into the doped region DG in order to produce the additional doping.

It is also possible to introduce the dopant with such a high implantation energy that it penetrates through the surface layers right into the region of the additional doping to be produced. A dopant with a high penetration depth, for example boron ions, is preferably implanted. The doping can subsequently be homogenized. For this purpose, it is possible to introduce a temperature budget which suffices to drive the doping right into the desired region of the additional doping.

Figure 5B:
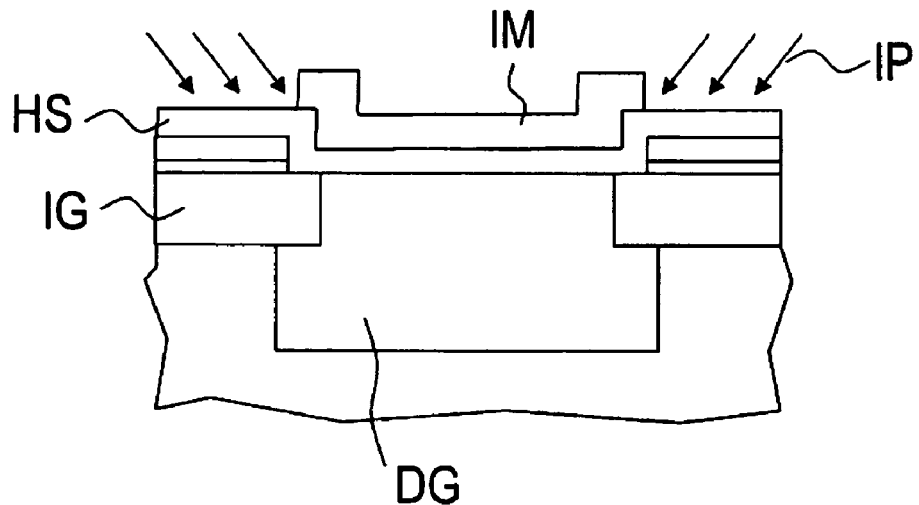

FIG. 5B shows an implantation IP—indicated by arrows—using the same mask as in FIG. 5A, but at an oblique implantation angle. In this way, the implanted dopant can penetrate below the mask and thus also introduce the additional doping in the desired zone.

Figure 6:
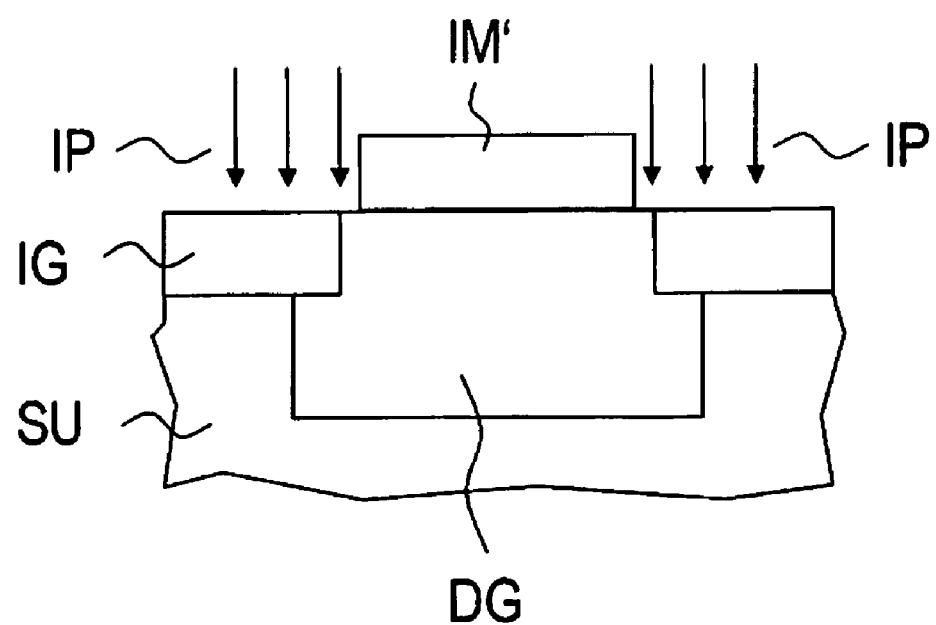
FIG. 6 shows the production of the additional doping by means of an FOX implant mask.

FIG. 6 shows a further possibility for producing the additional doping. In an early method stage, e.g. after defining the active zones by means of producing the insulation zones IG, the insulation effect thereof is intensified by introducing a doping of the second conductivity type as far as below the insulation zones IG. This anti-punch-through doping is led with a high implantation energy through the insulation zones IG, which are composed of field oxide, in particular. This implantation step can also be used to produce the additional doping in the boundary region between insulation zone and doped region DG. Insulation zones IG composed of field oxide, in particular, support the method since a field oxide is made thinner in the edge region than in the center and turns into a structure like a bird's beak, which can be penetrated more easily during the implantation of dopant. As an alternative or in addition, this implantation can also be carried out at an oblique implantation angle and/or subsequently be homogenized and activated by a heat treatment step.

Independently of the methods described, the additional doping GD at the edge region of the active diode interface can also be effected directly in a dedicated method by means of a separate mask step. If method steps which are already used as standard for producing a conventional diode are used for producing the additional doping, then they can also be varied differently such that an additional doping arises in the desired region. In particular, the masks used for implantation can be varied correspondingly. A deeper-reaching implantation can also be achieved by a procedure in which a so-called screen oxide, which is produced on the surface of semiconductor layers before an implantation step is carried out, is made correspondingly thinner.

In order to further optimize the component or in order to further minimize the dark current of a diode used as a photodiode, it is possible to optimize the area ratio—best illustrated in FIG. 2—between the window etched into the polysilicon layer PS and the underlying insulation layer IS and the uncovered surface of the doped zone DG. It has been shown that as the window becomes smaller within the polysilicon layer, the dark current is also reduced. Preferably, therefore, the geometry is chosen such that said window acquires a minimum size without the disadvantages that are obtained by virtue of the step formed within the semiconductor layer HS simultaneously being predominant.

The completion of the component and in particular the development of the diode to form the transistor can be effected by means of standard methods which are known per se and therefore need not be explained in any further detail here. For completion, the component can be covered with insulation and passivation layers and be connected via corresponding contacts reaching through the insulation. The doped region is preferably extended below the insulation zones or connected by an extended buried layer within the doped zone in low-impedance fashion to a corresponding contact applied on the surface of the component.

A photodiode completed in this way or a correspondingly formed phototransistor exhibits a significantly reduced dark current in comparison with a component of identical type without the abovementioned additional doping. The basic noise of the photodiode or of the phototransistor is thus reduced and a better signal-to-noise ratio is obtained. Incident light beams can therefore be detected with greater accuracy and higher sensitivity.

Although the invention has been explained only on the basis of a few figures, it is not restricted thereto. Further variations with regard to production method and component structure which come under the wording of the claims but are not explicitly explained here also lie within the scope of the invention.

The invention claimed is:

1. A diode comprising:
   a crystalline substrate composed of a semiconductor material;
   a doped region of a first conductivity type formed at a surface of the substrate;
   a semiconductor layer, which is applied on the surface of the substrate above the doped region and which has a doping of a second conductivity type;
   a pn junction at a boundary between the doped region and the semiconductor layer;
   an insulation zone formed at the surface of the substrate, the doped region being enclosed by the insulation zone;
   an insulation layer arranged on the crystalline substrate;
   a polysilicon layer arranged above the insulation layer; and
   a window in the insulation layer and the polysilicon layer, the window being dimensioned such that the doped region and a portion of the insulation zone adjacent to the doped region are uncovered;
   wherein, in lateral areas of the doped region, the pn junction is arranged in the substrate at a distance from the boundary between the surface of the substrate and the semiconductor layer.

2. The diode as claimed in claim 1, in which an additional doping of the second conductivity type is provided in the substrate at the lateral edge of the doped region in a manner enclosing the doped region.

3. The diode as claimed in claim 1, in which the semiconductor layer is an SiGe layer.

4. The diode as claimed in claim 1, in which the substrate comprises monocrystalline silicon.

5. The diode as claimed in claim 1, in which the semiconductor layer overlaps the region enclosed by the insulation zone and is grown in monocrystalline fashion above the substrate but in contrast in polycrystalline fashion above the insulation zone.

6. The diode as claimed in claim 1, in which the semiconductor layer is an epitaxial layer.

7. The diode as claimed in claim 1, in which the semiconductor layer has a thickness of less than 100 nm.

8. A photodiode comprising the diode as claimed in claim 1.

9. A phototransistor comprising the diode as claimed in claim 1.

* * * * *